United States Patent [19]
Ando et al.

[11] Patent Number: 5,173,445
[45] Date of Patent: Dec. 22, 1992

[54] METHOD OF MAKING P-TYPE COMPOUND SEMICONDUCTOR EMPLOYING TRIMETHYLGALLIUM, TRIMETHYLARSENIC AND ARSINE

[75] Inventors: Koji Ando; Tetsuya Yagi, both of Itami, Japan

[73] Assignee: Mitsubishi Denki Kabushiki Kaisha, Tokyo, Japan

[21] Appl. No.: 672,448

[22] Filed: Mar. 20, 1991

[30] Foreign Application Priority Data

Oct. 8, 1990 [JP] Japan .................. 2-270735

[51] Int. Cl.$^5$ ...................... H01L 21/20; H01L 21/36
[52] U.S. Cl. ...................... 437/81; 437/234; 437/971; 437/965; 437/107; 148/DIG. 110; 148/DIG. 65
[58] Field of Search ............ 437/81, 234, 965, 971, 437/107, 133; 148/DIG. 110, DIG. 65

[56] References Cited

U.S. PATENT DOCUMENTS 4,910,167  3/1990  Lee et al. .................. 437/107
4,935,381  6/1990  Speckman et al. ......... 148/DIG. 10

FOREIGN PATENT DOCUMENTS 62-104118  5/1987  Japan .
63-88820   4/1988  Japan .

OTHER PUBLICATIONS

Moon et al., "A Comparative Study of Selective Carbon Doping in MOCVD GaAs Using Trimethylarsenic and Arsine"; Journal of Electronic Materials, vol. 19, No. 12, pp. 1351-1355, 1990.
Blaauw et al., "Metalorganic Chemical-Vapour-Deposition Growth and Characterization of GaAs"; Can. J. Phys., vol. 63, 1985; pp. 664-669.
Kuech et al.; "Controlled carbon doping of GaAs by metalorganic vapor phase epitaxy"; Appl. Phys. Lett. 53(4); Oct. 1988; pp. 1317-1319.
Dorrity et al.; "Gallium Arsenide"; 1985; pp. 95-117.
Susaki et al, "Single Mode Transverse Junction Stripe Laser", IEEE Tokyo Section, 1978.

Primary Examiner—Brian E. Hearn
Assistant Examiner—Trung Dang
Attorney, Agent, or Firm—Leydig, Voit & Mayer

[57] ABSTRACT

A P-type compound semiconductor layer doped with carbon is formed on a semi-insulating substrate by placing the substrate in a reactor, and carrying out vapor-phase epitaxy by feeding and thermally decomposing vapors of an organic metal compound including a methyl radical, arsine, and an alkyl compound of arsenic substantially simultaneously into the reactor so that a C-doped P-type compound semiconductor is deposited on the substrate.

18 Claims, 3 Drawing Sheets

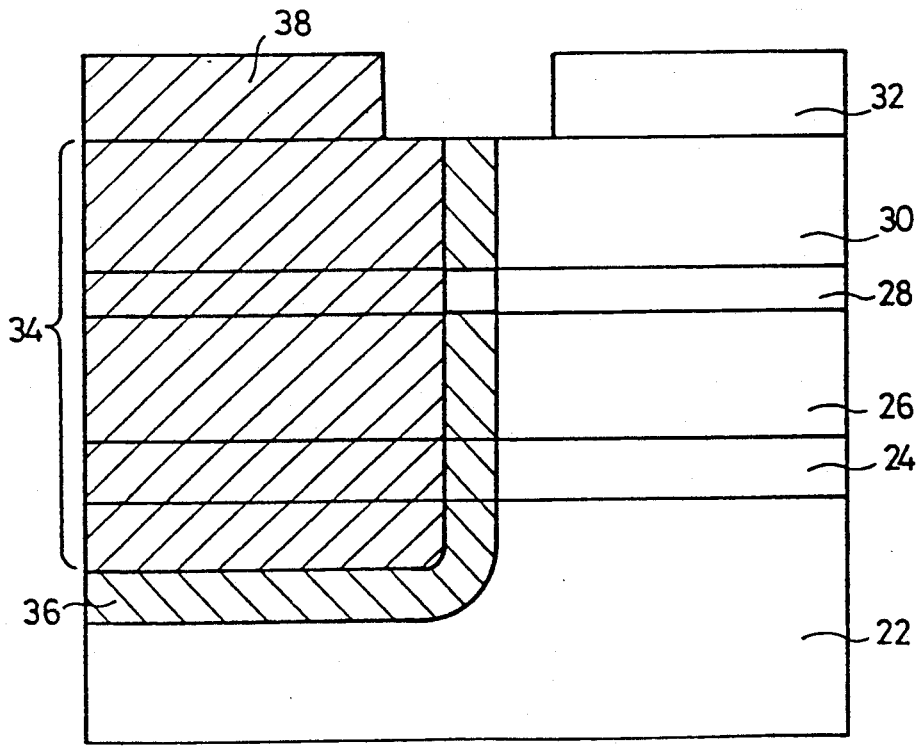
F I G. 2

METHOD OF MAKING P-TYPE COMPOUND SEMICONDUCTOR EMPLOYING TRIMETHYLGALLIUM, TRIMETHYLARSENIC AND ARSINE

This invention relates to a semiconductor light-emitting device, such as a semiconductor laser, and also to a method of making it. The present invention relates also to a method of forming a P-type compound semiconductor layer which can be used as a part of a semiconductor light-emitting device, such as a semiconductor laser.

BACKGROUND OF THE INVENTION

There are various types of semiconductor lasers. One example is a TJS (Transverse Junction Stripe) laser shown in FIG. 1. This TJS laser may be fabricated in the following manner. First, a magnesium-doped (Mg-doped) P-type GaAs layer 4 is grown on a semi-insulating gallium arsenide (GaAs) substrate 2 by liquid-phase epitaxy. Then, a lower tellurium-doped (Te-doped) N-type AlGaAs cladding layer 6 is grown on the Mg-doped P-type GaAs layer 4 by liquid-phase epitaxy. On the lower cladding layer 6, a Te-doped N-type AlGaAs active layer 8 is grown by liquid-phase epitaxy. Again liquid-phase epitaxy is used to grow an upper Te-doped AlGaAs cladding layer 10 on the active layer 8. Then, a Te-doped N-type GaAs layer 12 is grown on the upper cladding layer 10 by liquid-phase epitaxy. Thereafter, Zn is diffused from the top surface of the Te-doped N-type GaAs layer 12 into the structure including the GaAs layer 2, the Mg-doped P-type GaAs layer 4, the lower cladding layer 6, the active layer 8, the upper cladding layer 10, and the Te-doped N-type GaAs layer 12, so as to convert respective portions of the layers 2, 4, 6, 8, and 10 into a Zn-diffused P+-type region 14. By this Zn diffusion, a portion of the Te-doped N-type GaAs layer 12 is converted into a Zn-doped P+-type GaAs layer 16. Then, Zn in the Zn-diffused P+-type region 14 and the Zn-doped P+-type GaAs layer 16 is diffused outward of the region 14 and the layer 16 to thereby form a Zn-drive-in-diffused P-type region 18, as shown. Thereafter, that portion of the P-type region 18 which is located between the layer 12 and the layer 16, and portions of the layers 12 and 16 on opposite sides thereof are etched away, so that a Te-doped N-type GaAs layer 12a and a Zn-doped P+-type GaAs contact layer 12b result.

In manufacturing the TJS semiconductor laser of FIG. 1, liquid-phase epitaxy is used to form the P-type GaAs layer 4, the lower cladding layer 6, the active layer 8, the upper cladding layer 10, and the N-type GaAs layer 12. However, when variations in performance and reproducibility of the semiconductor lasers are taken into consideration, it is desirable to use vapor-phase epitaxy involving thermal decomposition, such as MOMBE (metalorganic molecular beam epitaxy) and MOCVD (metalorganic chemical vapor deposition).

However, when vapor-phase epitaxy involving thermal decomposition is used, a problem occurs when the P-type GaAs layer 4 is formed. Assuming that Zn which is usable in vapor-phase epitaxy is used in place of Mg, which cannot be used in vapor-phase epitaxy, to form a Zn-doped P-type GaAs layer in place of the Mg-doped P-type GaAs layer 4 by thermal-decomposition-involving vapor-phase epitaxy, Zn would diffuse from the Zn-doped P-type GaAs layer into the GaAs layer 2 and into the Te-doped N-type AlGaAs layer 6 during the diffusion step for forming the Zn-diffused P+-type region 14 and during the drive-in diffusion step for forming the Zn-drive-in-diffused P-type region 8, because the diffusion rate of Zn is high. This diffusion reduces the carrier concentration of the Zn-doped P-type GaAs layer.

In order to avoid this problem, the Mg-doped P-type GaAs layer 4 is formed because Mg has a low diffusion rate, but is unusable in thermal-decomposition-involving vapor-phase epitaxy.

Carbon (C) is known as a dopant which has a very low diffusion rate and is still usable in vapor-phase epitaxy in which thermal decomposition takes place. It is, therefore, desired to use C to form a P-type GaAs semiconductor layer by vapor-phase epitaxy involving thermal decomposition.

Processes for forming a P-type GaAs semiconductor, using C as a dopant, are disclosed in, for example, Japanese Published Patent Application No. SHO 62-104118 and Japanese Published Patent Application No. SHO 62-88820. According to the method of the former Japanese application, a P-type GaAs semiconductor layer is formed by MBE (molecular beam epitaxy), using trimethylgallium and arsenic as vapor sources. In the manufacturing method disclosed in Japanese Published Patent Application No. SHO 63-88820, trimethylgallium and arsine are alternately fed while a P-type GaAs semiconductor layer is being formed by MOCVD.

However, the method disclosed in Japanese Published Patent Application No. SHO 62-104118 has disadvantages that processes other than MBE cannot be used and that adjustment of the concentration of C is difficult. A problem encountered in the process of Japanese Published Patent Application No. SHO 63-88820 is that although adjustment of the concentration of C is possible, the manufacturing process is complicated since it is necessary to alternately supply trimethylgallium and arsine.

An object of the present invention is to provide a method of making P-type gallium arsenide semiconductor, using C as a dopant.

Another object of the present invention is to provide a semiconductor light-emitting device in which a P-type gallium arsenide semiconductor layer doped with C is incorporated as part thereof, and also a method of making such a semiconductor light-emitting device.

SUMMARY OF THE INVENTION

According to one aspect of the present invention, a P-type GaAs semiconductor layer is formed by vapor-phase epitaxy involving thermal decomposition, in which an organic metal compound including a methyl radical, arsine, and an alkyl compound of arsenic are used as vapor sources.

According to another aspect of the invention, a semi-insulating substrate is placed in a reactor, and an organic metal compound including a methyl radical, arsine, and an alkyl compound of arsenic are substantially simultaneously supplied into the reactor to cause vapor-phase epitaxial growing process involving thermal decomposition to take place so that a P-type compound semiconductor layer is formed on the semi-insulating substrate with C used as a dopant.

According to still another aspect of the present invention, a semiconductor laser device is provided, which includes a semi-insulating substrate, a P-type first semiconductor layer disposed on the substrate, an N-type second semiconductor layer disposed on the first semiconductor layer, an N-type third semiconductor layer disposed on the second semiconductor layer having a narrower forbidden band gap than the first and second semiconductor layers, an N-type fourth semiconductor layer disposed on the third semiconductor layer having a wider forbidden band gap than the third semiconductor layer, and a P-type region formed by diffusion into portions respectively of at least the second, third and fourth semiconductor layers, and in which carbon is used as a dopant in the first semiconductor layer.

According to a further aspect of the present invention, a method of making the semiconductor laser device as above-described is provided. This method includes a step of forming the first semiconductor layer by vapor-phase epitaxy involving thermal decomposition of an organic metal compound including a methyl radical, arsine, and an alkyl compound of arsenic used as vapor sources, and steps of forming the second, third and fourth semiconductor layers by vapor-phase epitaxy involving thermal decomposition.

BRIEF DESCRIPTION OF THE DRAWINGS

FIG. 2 is a cross-sectional view of a TJS laser according to one embodiment of the present invention.

DETAILED DESCRIPTION OF PREFERRED EMBODIMENT

Figure 1:
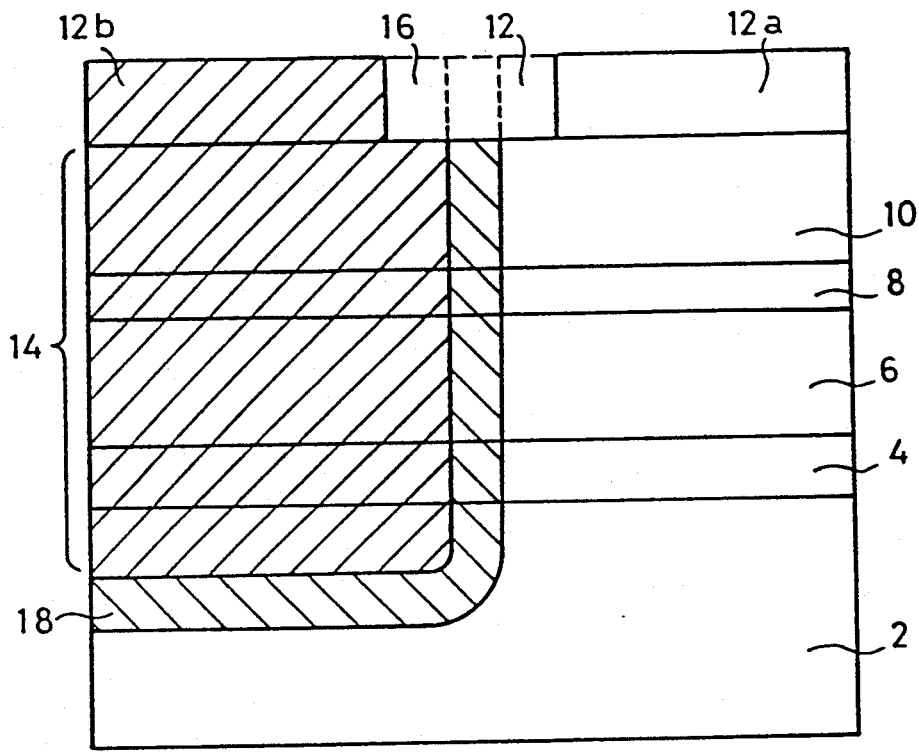
FIG. 1 is a cross-sectional view of a conventional TJS laser.

Now, the present invention is described in terms of a semiconductor light-emitting device, for example, a TJS semiconductor laser device. As shown in FIG. 2, the TJS semiconductor laser device according to one embodiment of the present invention includes a semi-insulating GaAs substrate 22. On the top surface of the substrate 22, a C-doped P-type GaAs layer 24 is disposed, which functions as a layer that is not active optically. The C-doped P-type GaAs layer 24 has a thickness of, for example, 0.1–0.3 $\mu$m and has a C concentration of, for example, from $1 \times 10^{18}$ cm$^{-3}$ to $10 \times 10^{18}$ cm$^{-3}$.

A selenium-doped (Se-doped) N-type Al$_{0.36}$Ga$_{0.64}$As lower cladding layer 26 is disposed on the top surface of the C-doped P-type GaAs layer 24. The lower cladding layer 26 has a thickness of, for example, 0.5–3 $\mu$m and has a Se concentration of, for example, from $1 \times 10^{17}$ cm$^{-3}$ to $10 \times 10^{17}$ cm$^{-3}$.

A Se-doped N-type Al$_{0.06}$Ga$_{0.94}$As active layer 28 is disposed on the top surface of the lower cladding layer 26. The active layer 28 has a thickness of, for example, 500–1500 Å and has a Se concentration of, for example, from $1 \times 10^{17}$ cm$^{-3}$ to $10 \times 10^{17}$ cm$^{-3}$. Because the active layer 28 has a composition of Al$_{0.06}$Ga$_{0.94}$As, its forbidden band gap is narrower than those of the P-type GaAs layer 24 and the lower cladding layer 26.

On the top surface of the active layer 28, a Se-doped N-type Al$_{0.36}$Ga$_{0.64}$As upper cladding layer 30 is disposed, which has a thickness of, for example, 0.5–3 $\mu$m and a Se concentration of, for example, from $1 \times 10^{17}$ cm$^{-3}$ to $10 \times 10^{17}$ cm$^{-3}$. The upper cladding layer 30 has the same composition as the lower cladding layer and has a wider forbidden band gap than the active layer 28.

On the top surface of the upper cladding layer 30, a Se-doped N-type GaAs contact layer 32 is disposed.

The contact layer 32 has a thickness of, for example, 1–3 $\mu$m and has a Se concentration of, for example, from $3 \times 10^{18}$ cm$^{-3}$ to $10 \times 10^{18}$ cm$^{-3}$.

A Zn-diffused P$^+$-type region 34 is formed to extend through respective portions of the GaAs layer 22, the P-type GaAs layer 24, the lower cladding layer 26, the active layer 28, and the upper cladding layer 30, as shown in FIG. 2. Between the Zn-diffused P$^+$-type region 34 and those portions of the layers 22, 24, 26, 28 and 30 into which Zn has not been diffused, a Zn-drive-in-diffused P-type region 36 extends. The width of the Zn-drive-in-diffused P-type region 36 is, for example, 2–4 $\mu$m.

On the Zn-diffused P$^+$-type region 34, a Zn-doped P$^+$-type GaAs contact layer 38 is formed, which, similar to the contact layer 32, has a thickness of, for example, 1–3 $\mu$m. The thickness of the Zn-diffused P$^+$-type region 34 is, for example, 2–4 $\mu$m. The Zn concentration of the contact layer 38 and the Zn-diffused P$^+$-type region 34 is, for example, $0.8 \times 10^{19}$ cm$^{-3}$ to $2 \times 10^{19}$ cm$^{-3}$, and the Zn concentration of the Zn-drive-in-diffused P-type region 36 is, for example, $0.5 \times 10^{18}$ cm$^{-3}$ to $5 \times 10^{18}$ cm$^{-3}$.

As is known, when positive and negative voltages are applied to the contact layers 38 and 32, respectively, laser oscillations occur in the region which is the intersection of the Zn-drive-in-diffused P-type region 36 and the active layer 28.

A P-type region has a higher index of refraction than a P$^+$-type region. The structure of FIG. 2 takes advantage of this fact to improve the confinement of the generated laser light by incorporating the Zn-drive-in-diffused P-type region 36.

The P-type GaAs layer 24, the lower cladding layer 26, the active layer 28, the upper cladding layer 30, and the contact layer 32 of the TJS laser device of FIG. 2 can be formed by MOCVD, for example. The growth temperature may be, for example, 800° C.

Figure 3:
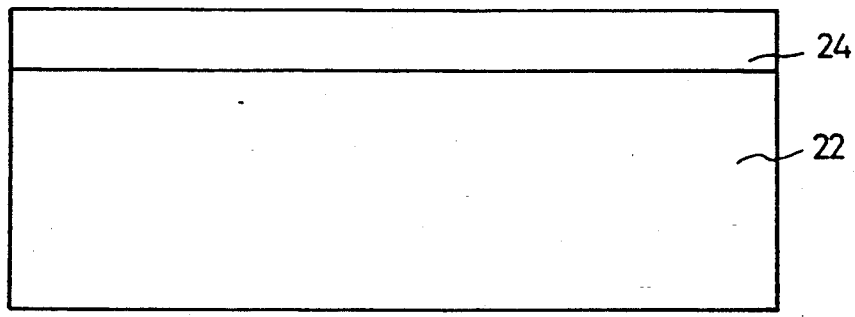
FIGS. 3 through 6 are cross-sectional views in various steps of making the TJS laser of FIG. 2.

First, in order to fabricate the P-type GaAs layer 24 as shown in FIG. 3, an organic metal compound including a methyl radical, such as, for example, trimethylgallium (CH$_3$)$_3$Ga, arsine (AsH$_3$) and an alkyl compound of arsenic, such as, for example, trimethylarsenic, (CH$_3$)$_3$As, are used. Trimethylgallium is fed into a reactor, in which the GaAs substrate 22 is placed, at a pressure of, for example, 39 mmHg and at a flow rate of, for example, 3 cc/min. Trimethylarsenic is fed to the reactor at a pressure of, for example, 233 mmHg and at a flow rate of, for example, 50 cc/min. Arsine is fed in a ratio of, for example, 0.6–0.9 with respect to trimethylarsenic. In other words, if the flow rate of arsine is chosen to be the same as the above-stated flow rate of trimethylarsenic, namely, 50 cc/min, for example, a pressure of from $233 \times 0.6$ mmHg to $233 \times 0.9$ mmHg is employed for arsine. On the other hand, if the same pressure as trimethylarsenic namely, 233 mmHg, is used, the flow rate of arsine is from $50 \times 0.6$ cc/min to $50 \times 0.9$ cc/min. Trimethylgallium, arsine, and trimethylarsenic are fed to the reactor substantially simultaneously.

It is considered that the following reactions take place in the reactor.

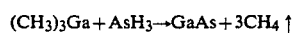

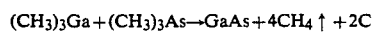

2C is solid, and GaAs is doped with this 2C. From the abovedescribed reactions, it is seen that GaAs could be doped with carbon through the reaction of trimethylgallium and trimethylarsine only. In such a case, the C concentration must be controlled by changing the growth temperature. However, since the growth temperature is an essential factor for MOCVD and, therefore, it is desirable to maintain the growth temperature constant both when the P-type GaAs layer 24 is formed and when the lower cladding layer 26, the active layer 28 and the upper cladding layer 30 are formed, using MOCVD, it is not desirable to change the growth temperature. According to the present invention, it is not necessary to change the growth temperature to control the concentration of carbon. Instead, according to the present invention, arsine is additionally used and the amount of arsine is changed within the range stated above to control the concentration of carbon.

Figure 4:
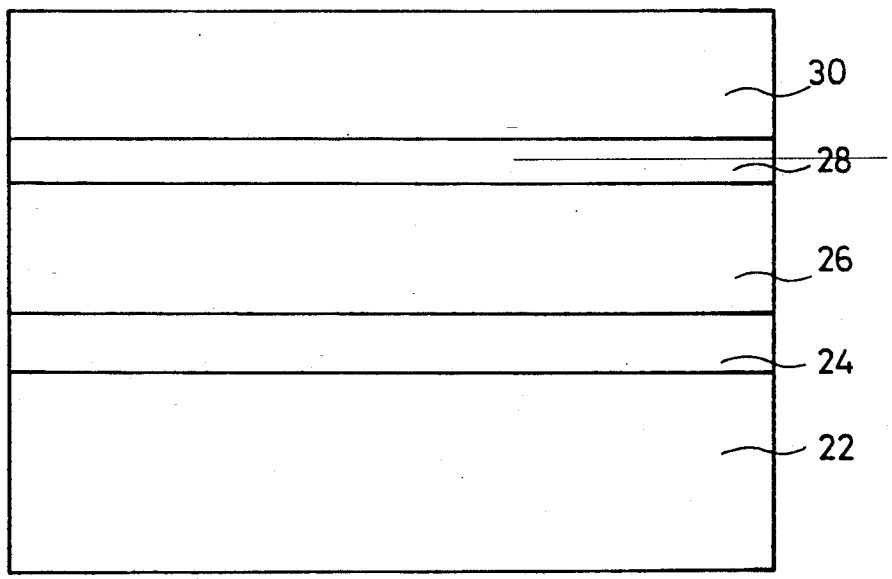

After the P-type GaAs layer 24 is formed in the manner stated above, the lower cladding layers 26, the active layer 28, and the upper cladding layer 30 are successively formed from trimethylaluminum, trimethylgallium, arsine, and hydrogen selenide, as shown in FIG. 4.

Figure 5:
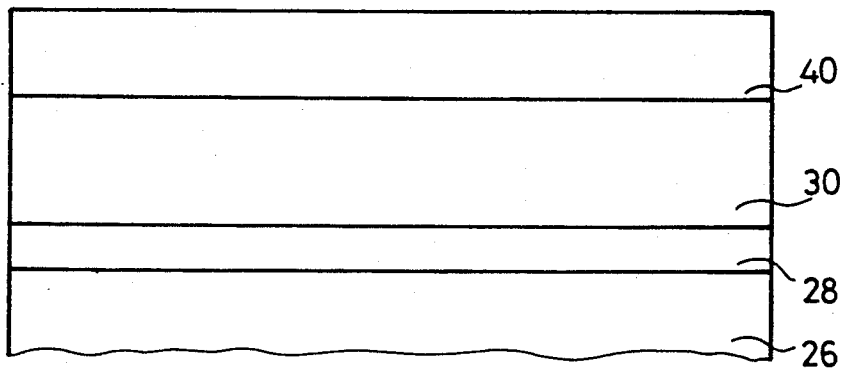

Thereafter, from trimethylgallium, arsine, and hydrogen selenide, the Se-doped N-type GaAs layer 40 from which the contact layers 32 and 38 are to be made is formed on the upper cladding layer 30, as shown in FIG. 5.

Figure 6:
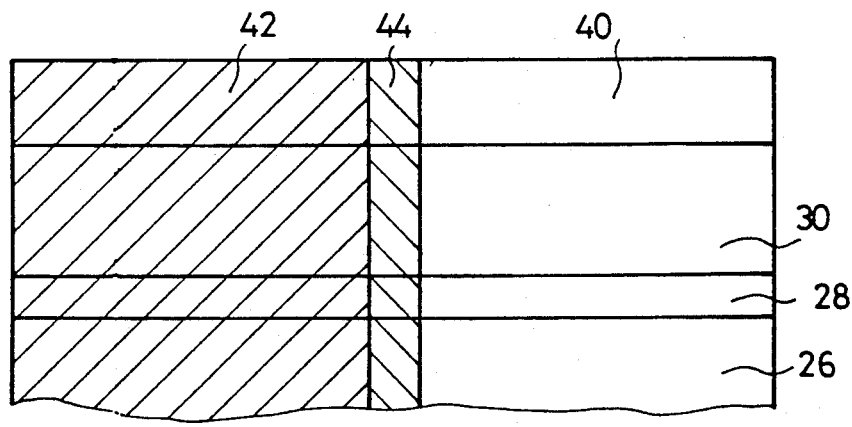

Then, as shown in FIG. 6, Zn is diffused from a portion of the upper surface of the GaAs layer 40 to dope portions respectively of the GaAs layer 40, the upper cladding layer 30, the active layer 28, the lower cladding layer 26, the P-type GaAs layer 24, and the GaAs layer 22. The Zn changes these portions into a P-type region 42. Then, Zn in the Zn-doped P-type diffusion region 42 is drive-in diffused to thereby form a Zn-drive-in-diffused P-type region 44. Finally, a portion of the GaAs layer 40 and that portion of the Zn-doped P-type diffusion region 42 which forms a PN junction with the GaAs layer 40 are removed, which results in the Zn-doped P+-type GaAs contact layer 38, the Se-doped N-type GaAs contact layer 32, the Zn-diffused P+-type region 34, and the Zn-drive-in-diffused P-type region 36, as shown in FIG. 2.

In the above-described embodiment, the C-doped P-type GaAs layer 24 is part of a TJS laser, but such a C-doped P-type GaAs layer can be a part of semiconductor lasers of other types, or of other semiconductor light-emitting devices, such as a photodiode. It can also be formed as part of an HEMT (high electron mobility transistor) or the like. Further, in the above-described embodiment, it is a GaAs layer that is doped with carbon, but the present invention can be used to dope other compound semiconductors, such as AlGaAs, with carbon. Although, in the above-described embodiment, the Zn-drive-in-diffused P-type region is used, it is not necessarily needed. Furthermore, the Zn-diffused P+-type region 34 is described as extending into a portion of the GaAs layer 22, but it may extend only as far as, for example, the P-type GaAs layer 24. The present invention has been described in terms of an embodiment which uses MOCVD, but it can be implemented by MOMBE.

What is claimed is:

1. A method of growing a P-type epitaxial GaAs film on a substrate, the film including carbon in a concentration ranging from about $10^{18}$ cm$^{-3}$ to about $10^{19}$ cm$^{-3}$ comprising simultaneously decomposing an organic gallium compound including a methyl radical, arsine, and an alkyl compound of arsenic at about 800° C.

2. The method according to claim 1 wherein said organic gallium compound including a methyl radical is trimethylgallium.

3. The method according to claim 1 wherein said alkyl compound of arsenic is trimethylarsenic.

4. The method according to claim 1 wherein arsine is mixed in the ratio of from 0.6 to 0.9 gallium to said organic compound including a methyl radical.

5. The method according to claim 1 wherein said organic gallium compound including a methyl radical is trimethylgallium, said alkyl compound of arsenic is trimethylarsenic, and arsine is mixing in a ratio of from 0.6 to 0.9 with respect to trimethylgallium.

6. A method of growing a P-type epitaxial GaAs film on a substrate, the film including carbon in a concentration ranging from about $10^{18}$ cm$^{-3}$ to about $10^{19}$ cm$^{-3}$ comprising:
   placing a semi-insulating substrate in a reactor; and
   supplying an organic gallium compound including a methyl radical, arsine, and an alkyl compound of arsenic substantially simultaneously to said reactor and thermally decomposing the organic gallium compound, arsine, and alkyl compound simultaneously at about 800° C., whereby a P-type GaAs film doped with carbon in a concentration ranging from about $10^{18}$ cm$^{-3}$ to about $10^{19}$ cm$^{-3}$ is grown on said semi-insulating substrate.

7. The method according to claim 6 wherein said organic gallium compound including a methyl radical is trimethylgallium.

8. The method according to claim 6 wherein said alkyl compound of arsenic is trimethylarsenic.

9. The method according to claim 6 wherein arsine is mixed in the ratio of from 0.6 to 0.9 with respect to said organic gallium compound including a methyl radical.

10. The method according to claim 6 wherein said organic gallium compound including a methyl radical is trimethylgallium, said alkyl compound of arsenic is trimethylarsenic, and arsine is mixed in a ratio of from 0.6 to 0.9 with respect to trimethylgallium.

11. A method of making a semiconductor laser device, said semiconductor laser device comprising a semi-insulating substrate, a P-type GaAs layer doped with carbon in a concentration ranging from about $10^{18}$ cm$^{-3}$ to about $10^{19}$ cm$^{-3}$ and disposed on said substrate, an N-type second semiconductor layer disposed on said first semiconductor layer, an N-type third semiconductor layer disposed on said second semiconductor layer having an energy band gap narrower than the energy band gaps of said first and second semiconductor layers, an N-type fourth semiconductor layer disposed on said third semiconductor layer having an energy band gap wider than that of said third semiconductor layer, and a P-type region formed by diffusion and extending through respective portions of at least said second, third, and fourth semiconductor layers, said method comprising:
   forming a GaAs layer by simultaneously thermally decomposing an organic gallium compound including a methyl radical, arsine, and an alkyl compound of arsenic at about 800° C.; and
   forming said second, third, and fourth semiconductor layers by vapor-phase epitaxy.

12. The method of making a semiconductor laser device according to claim 11 wherein said organic gallium compound including a methyl radical is trimethylgallium.

13. The method of making a semiconductor laser device according to claim 11 wherein said alkyl compound of arsenic is trimethylarsenic.

14. The method of making a semiconductor laser device, according to claim 11 wherein arsine is mixed in a ratio of from 0.6 to 0.9 with respect to said organic gallium compound including a methyl radical.

15. The method of making a semiconductor laser device, according to claim 11 wherein said organic gallium compound including a methyl radical is trimethylgallium, said alkyl compound of arsenic is trimethylarsenic, and arsine is mixed in a ratio of from 0.6 to 0.9 with respect to trimethylgallium.

16. The method according to claim 1 wherein said organic gallium compound including a methyl radical is trimethylgallium and said alkyl compound of arsenic is trimethylarsenic including supplying trimethylarsenic and trimethylgallium in a volume ratio of about 100 trimethylarsenic to 1 trimethylgallium.

17. The method according to claim 6 wherein said organic gallium compound including a methyl radical is trimethylgallium and said alkyl compound of arsenic is trimethylarsenic including supplying trimethylarsenic and trimethylgallium in a volume ratio of about 100 trimethylarsenic to 1 trimethylgallium.

18. The method according to claim 11 wherein said organic gallium compound including a methyl radical is trimethylgallium and said alkyl compound of arsenic is trimethylarsenic including supplying trimethylarsenic and trimethylgallium in a volume ratio of about 100 trimethylarsenic to 1 trimethylgallium.

* * * * *

UNITED STATES PATENT AND TRADEMARK OFFICE
CERTIFICATE OF CORRECTION

PATENT NO. : 5,173,445

DATED : December 22, 1992

INVENTOR(S) : Ando et al.

It is certified that error appears in the above-identified patent and that said Letters Patent is hereby corrected as shown below:

Claim 4, col. 6, lines 9 and 10, change "gallium to said organic compound including a methyl radical" -- to said organic gallium compound including a methyl radical--.

Claim 5, col. 6, line 15, change "mixing" to --mixed--.

Signed and Sealed this

Twenty-eighth Day of December, 1993

Attest:

BRUCE LEHMAN

*Attesting Officer*  *Commissioner of Patents and Trademarks*